United States Patent
La Rosa et al.

(10) Patent No.: US 7,710,141 B2
(45) Date of Patent: May 4, 2010

(54) METHOD AND APPARATUS FOR DYNAMIC CHARACTERIZATION OF RELIABILITY WEAROUT MECHANISMS

(75) Inventors: Giuseppe La Rosa, Fishkill, NY (US);
Kevin Kolvenbach, Walden, NY (US);
Ping-Chuan Wang, Hopewell Junction, NY (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 11/968,444

(22) Filed: Jan. 2, 2008

(65) Prior Publication Data

US 2009/0167336 A1    Jul. 2, 2009

(51) Int. Cl.
*G01R 31/26* (2006.01)
(52) U.S. Cl. ...................................................... 324/765
(58) Field of Classification Search .................... None
See application file for complete search history.

(56) References Cited

U.S. PATENT DOCUMENTS

| | | | |
|---|---|---|---|
| 6,521,469 B1 | 2/2003 | La Rosa et al. | |
| 7,183,791 B2 * | 2/2007 | Walker et al. | 324/769 |
| 7,472,322 B1 * | 12/2008 | Ma et al. | 714/724 |

* cited by examiner

*Primary Examiner*—Jermele M Hollington
(74) *Attorney, Agent, or Firm*—Howard M. Cohn; H. Daniel Schnurmann

(57) ABSTRACT

A method and apparatus for dynamic characterization of reliability wearout mechanisms is disclosed. The system comprises an integrated circuit incorporating a device under test to be measured, structure for inputting a waveform to the device under test for a first predetermined time interval, structure for disabling the inputting of the waveform to the device under test, structure for measuring one or more fundamental parameters of the device under test after a second predetermined time interval, and structure for calculating an aging estimate of the device under test without the influence of recovery effect based on the one or more measured fundamental parameters. The time between stressing and measurement is precisely controlled, providing for repeatable experiments, and serves to minimize measurement error caused by recovery effects.

19 Claims, 9 Drawing Sheets

METHOD AND APPARATUS FOR DYNAMIC CHARACTERIZATION OF RELIABILITY WEAROUT MECHANISMS

FIELD OF THE INVENTION

The present invention relates generally to reliability testing of semiconductor devices and, more particularly, to an improved method and apparatus for dynamic characterization of reliability wearout mechanisms.

BACKGROUND OF THE INVENTION

There are two major types of FET (Field-Effect Transistor) devices, the metal-oxide-semiconductor field effect transistor or MOSFET (also called an insulated-gate FET, or IGFET), and the junction-gate FET, or JFET. An FET has a control gate and source and drain regions formed in a substrate. In MOSFETs, the control gate is formed above a thin dielectric insulator (gate dielectric) overlying a doped "channel" region between the source and drain regions. JFETs, like MOSFETs, have a doped channel region between their source and drain region but in JFETs, the control gate is formed by an oppositely doped gate region surrounding the channel region and forming a p-n junction therewith (hence the name "junction-gate" FET). In normal operation, this p-n junction is reverse biased. As the voltage applied to the control gate is varied, the electric field formed between the gate region and the channel region affects free carriers in the channel region to form a larger or smaller conduction channel through the channel region depending upon the applied gate voltage (the "field effect"). The gate voltage at which the conduction channel "pinches off" and becomes non-conductive is referred to as the "pinch off" voltage.

FET devices can be used as either amplifying or switching devices in electronic circuits. When used as an amplifying device, control of conduction between the source and drain through the channel region is used to amplify small AC signals. When used as a switching device (binary mode), a small current is used to switch the transistor between an "on" state and an "off" state. In a typical switching application, when the applied gate voltage causes a conduction channel to form, the FET device turns "on" and current can flow between the source and drain regions. Conversely, when the applied gate voltage causes the conduction channel to disappear or "pinch off", the FET device turns "off" and current flow between the source and drain regions is blocked.

Modern computers, consumer electronics devices, and other computerized devices employ integrated circuit devices comprising many transistors operating in binary mode. In recent years, the computing power of computers and consumer electronic devices has increased dramatically. This has been accomplished by dramatic reductions in the size of transistor devices, resulting in a corresponding increase in the number of transistors on an integrated circuit device, in turn enabling reductions in the overall size of computer or consumer electronics devices, thereby increasing the amount of computing power that can be fit within a given volume. In addition, by increasing the number of transistors in an integrated circuit device, operational problems such as cross talk between physically adjacent conductors and signal propagation delays between different sections of a computing device can be reduced. As computers and consumer electronics continue to require increased computing power, there is considerable incentive for the semiconductor industry to continue the current trend towards increasingly compact and complex integrated circuits.

This trend toward more complex integrated circuits has been driven by increasing density of individual circuit elements on integrated circuit devices. Circuit elements such as metal oxide semiconductor field effect transistors (MOSFETs), resistors, etc. are typically used as components in an integrated circuit design. To increase the number of circuit elements within an integrated circuit, it is necessary to decrease the size of individual circuit elements. The size of individual circuit elements cannot be reduced arbitrarily. There are limitations to size reduction, including dimensional tolerance capabilities associated with manufacturing processes and various electrical phenomena that are associated with physical dimensions of circuit elements. In addition, the essential requirement for high reliability of integrated circuits itself places limitations on shrinking the size of such elements. The steps of identifying these and other limitations and discovering techniques for ameliorating these limitations have made possible the increasing complexity of integrated circuits.

As an example, the prior art in the field of manufacture, testing, and use of MOSFET devices has identified several problems that occur during long-term use of such devices. Of particular concern are various degradation or dynamic "wearout" mechanisms including, but not limited to, channel hot carrier (CHC) damage, negative bias temperature instability (NBTI) and Electromigration (EM).

NBTI in a MOSFET device is a serious detriment to the long-term stability of the MOSFET device. As explained in U.S. Pat. No. 6,521,469 to La Rosa et al., which is incorporated in its entirety by reference herein, NBTI results from charge buildup at the silicon—silicon oxide interface and is due to the influence of negative voltages on the gate electrode of MOS structures.

The simultaneous demands for higher drive current at lower operating voltages has led to more serious concerns over negative bias temperature instability (NBTI), which significantly shifts threshold voltage and reduces drive current. There are also indications that NBTI worsens exponentially with thinning gate oxide, and Vt (threshold voltage) shifts in the order of 50 mV are serious for devices operating at 1.2 V or below.

In order to produce accurate predictions of the expected service life and reliability of CMOS (Complementary Metal-Oxide-Semiconductor) integrated circuit technologies, it is essential to quantify the dynamic wearout mechanisms that can adversely affect the performance of the circuit elements (e.g., transistors, resistors) employed by those technologies. In SiO2 based CMOS technologies, Channel Hot Carrier (CHC) and NBTI damage have been identified as two key transistor-level FEOL (front end of line) wearout mechanisms that can reduce transistor lifetime. Typically these mechanisms are characterized under DC stress conditions and the effect of AC stressors is estimated based upon a "quasi-static" approximation.

Recent experimental data suggest that the quasi static approximation may not be accurate in the case of NBTI due to recovery effects. Evidently, there is a recovery effect that can occur whereby observable accelerated aging effects (e.g., threshold shift) due to applied AC "overstresses" can tend to reverse themselves over a period of time after the stress signals are removed. That is, the degradation (e.g., threshold shift) measured immediately after removing the stress will be greater than the degradation measured at some time later. Using conventional prior-art stress/characterization techniques, considerable time can elapse between stress and measurement, resulting in mischaracterization of the rate of degradation and inaccurate device lifetime predictions. This is particularly critical in High K technologies where the role of electron trapping in AC operation needs to be characterized.

Another problem with current accelerated aging techniques relates to the characterization of resistor/wire Electron Migration (EM) aging under AC condition. It can be expected that there will be an improvement of the End Of Life lifetime under AC stress conditions as compared to DC stress conditions. Currently, the difference between electro migration aging effects under DC and AC operating conditions is measured using external (to the chip) pulse generators to apply AC stress waveforms to the device under test (DUT). This approach is severely limited by the bandwidth of the cabling used for wafer level testing permitting DC vs. AC stress comparisons only at frequencies below 10 MHz.

There is thus a need in the art of reliability testing of MOSFET devices for improvement in the processes used to test for NBTI, which degrades the gate oxide of the MOSFET device, preferably without having to heat the full wafer on which the transistor is built. There is also a need for an NBTI test procedure that is sufficiently quick and cost-effective that the procedure can be applied to monitor NBTI on every lot in a semiconductor manufacturing line.

The current techniques used to characterize wearout have limitations that prevent a detailed characterization of both AC and DC wearout characteristics. Therefore, it is desirable to have a system and method that allows a better understanding, and capability for verifying experimentally, wearout mechanisms and their impacts on a given circuit design, to ensure continued high reliability for semiconductor devices and circuits.

SUMMARY OF THE INVENTION

The present inventive technique provides a practical mechanism for performing high-frequency AC stress aging analysis of a device (e.g., resistor, transistor, transmission gate or other circuit element) on an integrated circuit by integrating specialized AC stress waveform generation and control circuitry on-chip along with a device to be tested (DUT). The on-chip circuitry comprises an oscillator, waveshaping circuitry and waveform selection circuitry. The oscillator and waveshaping circuitry generate an AC signal having the desired frequency, pulse-width, shape, amplitude, etc. to produce a desired accelerating aging response in the DUT. Waveform selection circuitry allows either the internally generated AC stress signal or externally provided signals (e.g., provided via test pads) to be routed to the DUT. The DUT is provided with a set of dedicated test access points for connecting external measurement circuitry.

A typical AC stress characterization is performed as follows. First, a baseline characterization is performed. Next, an appropriate AC stress waveform is generated and applied to the DUT for a predetermined time. When the predetermined time interval expires, the AC stress signal is removed from the DUT. After a short, precise time interval has expired, the DUT is re-characterized. The results of this re-characterization are compared against the initial baseline characterization to determine what changes in device parameters and characteristics occurred as a result of stressing. This, in turn, is used in combination with knowledge about required in-circuit behavior of the device to predict the device's useful service lifetime under expected operating conditions. Because the predictions are based upon actual AC stress degradation measurements rather than on "guess-timates" of AC degradation derived from the results of DC stress measurements, these predictions can be made with higher confidence than would be possible using prior art estimation techniques.

The present inventive technique specifically provides for a re-characterizing the DUT after a short, well-controlled time delay. This is to avoid the influence of "recovery effects" (self-"healing" behavior) in the characterization that would occur if a longer time period were allowed to pass before re-characterization.

According to an aspect of the invention, on-chip test circuitry is integrated on a semiconductor wafer along with a device to be tested. The device can be a transistor, a resistive element, a transmission gate, or any other device suitable for accelerated again and dynamic stress characterization. The on-chip circuitry comprises an on-chip waveform generator and a waveform selector. The on-chip waveform generator operates under control of a set of waveform control signals to generate a desired AC stress waveform having specific desired characteristics. Controllable parameters of the waveform can include frequency, duty cycle, waveshape and the stress voltage (i.e., the amplitude and level of the AC stress signal). The device to be tested (DUT) is provided with a set of direct test access points to which external measurement equipment can be connected.

The waveform selector controls what signal(s) is(are) connected to the DUT at any given time. Under control of a selection signal, the waveform selector connects either the AC stress signal to the integrated device selector an external signal.

According to a further aspect of the invention, the on-chip waveform generator comprises an oscillator, a divider, a duty cycle control circuit, and a level shifter. The oscillator provides a continuous waveform to the divider, which divides the frequency by one of a predetermined set of divide ratios, according to the value of a ratio select signal. Preferably, the oscillator is a VCO (voltage controlled oscillator) acting in response to a control signal to set the frequency at its output. The duty cycle controller produces an output signal having a duty cycle selected from a predetermined set of duty cycle values (e.g., 25%, 50% and 75%), depending upon the state of a duty cycle select signal.

Alternatively, a waveshaping circuit can be substituted for the duty cycle control circuit. By way of example, the waveshaping circuit can be a filter circuit that converts the incoming waveform to a sine wave at its output. By way of further example, the waveshaping circuit could process the incoming waveform to produce a triangle wave at its output. By way of further example, the waveshaping circuit could be configurable to produce any of a predetermined set of output waveshapes depending upon the state of a waveshape select signal.

According to the present inventive technique, aging effects of a device under test can be determined by providing a semiconductor wafer having formed thereupon a device under test (DUT), an on-chip waveform generator, a waveform selector, and test access points for connecting external equipment. Next, external measurement equipment is connected to the test access points. The external equipment is used to perform a set of initial pre-stress measurements with the external measurement equipment to provide a baseline characterization of the device under test. After performing the baseline characterization, the waveform generator is controlled to produce an AC stress waveform having a set of desired characteristics (e.g., frequency, duty cycle, waveshape, amplitude, etc.). The waveform selector is controlled to apply and maintain application of the AC stress waveform to the device under test (DUT) for a predetermined first period of time Ts. Preferably Ts will be between 1 second and 10000 minutes. After Ts has expired, the waveform selector is controlled to disconnect the AC stress waveform from the device under test and to connect an externally provided signal in its place. Next, a second post-stress set of measurements is taken using the external measurement equipment (already in place) to develop a post-stress characterization of the device under test. This second characterization is compared with the baseline characterization to determine the effects of stress aging on the device under test, i.e., to determine what characteristics of the device's behavior have changed since the stress was applied.

According to an aspect of the invention, the post-stress characterization measurements are delayed from the removal of the AC stress signal by a short, precisely controlled time period Tc, preferably between 1 microsecond and 100 milliseconds.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
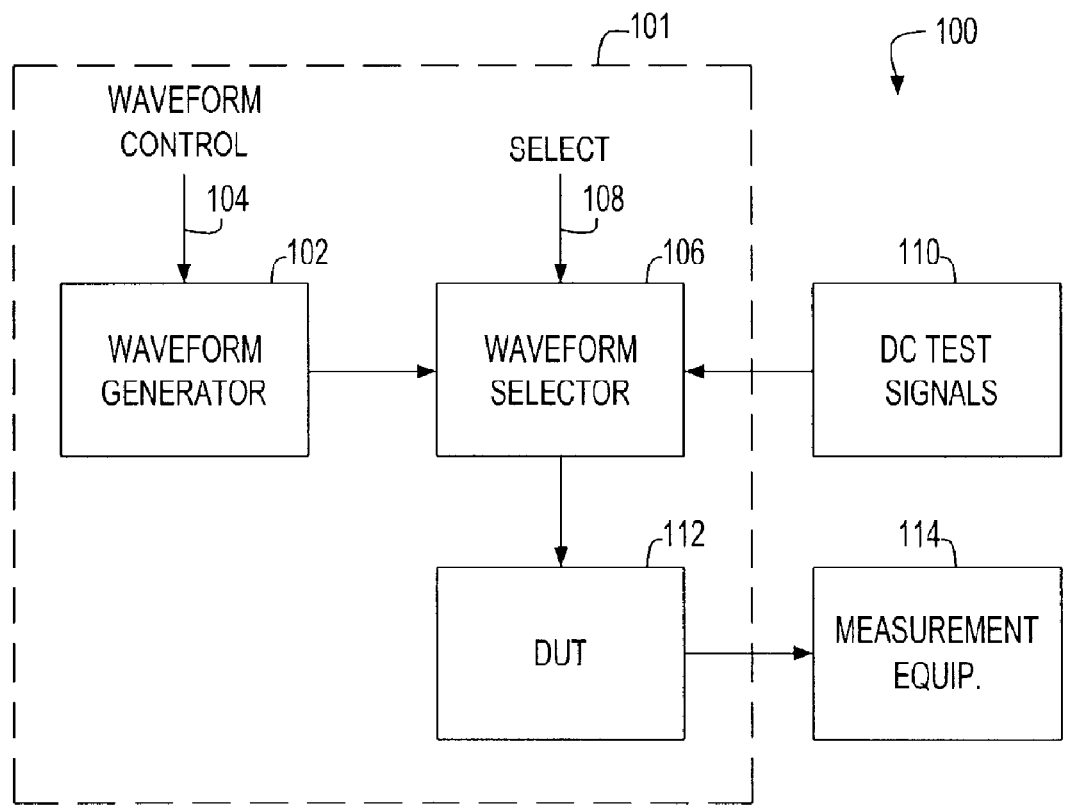

In the drawings accompanying the description that follows, in some cases both reference numerals and legends (labels, text descriptions) may be used to identify elements. If legends are provided, they are intended merely as an aid to the reader, and should not in any way be interpreted as limiting.

FIG. 1A is a block diagram of on-chip circuitry for characterizing wearout mechanisms in integrated circuit devices, in accordance with the invention.

Figure 1B:
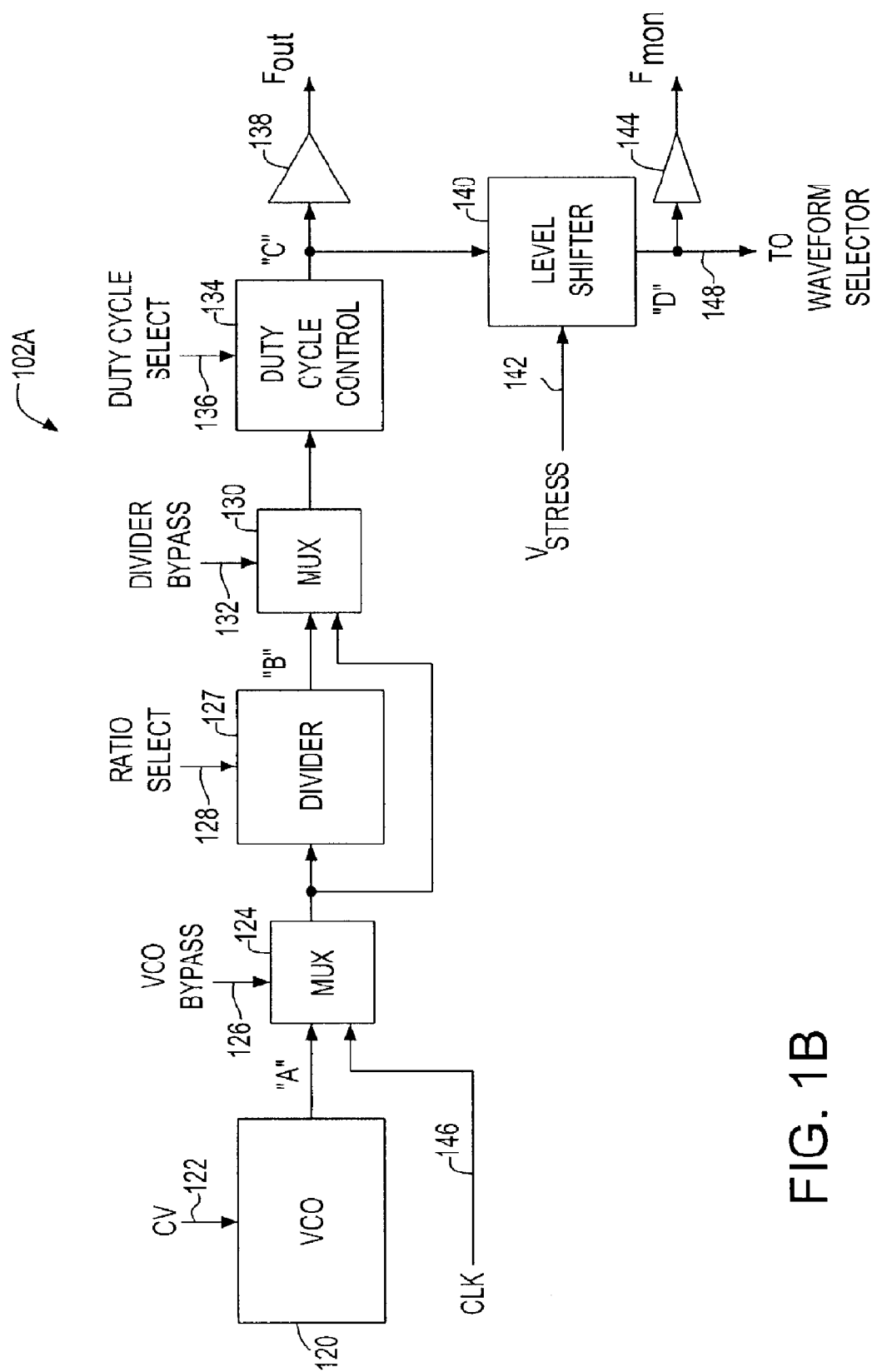

FIG. 1B is a block diagram of an embodiment of a waveform generator, in accordance with the invention.

Figure 1C:
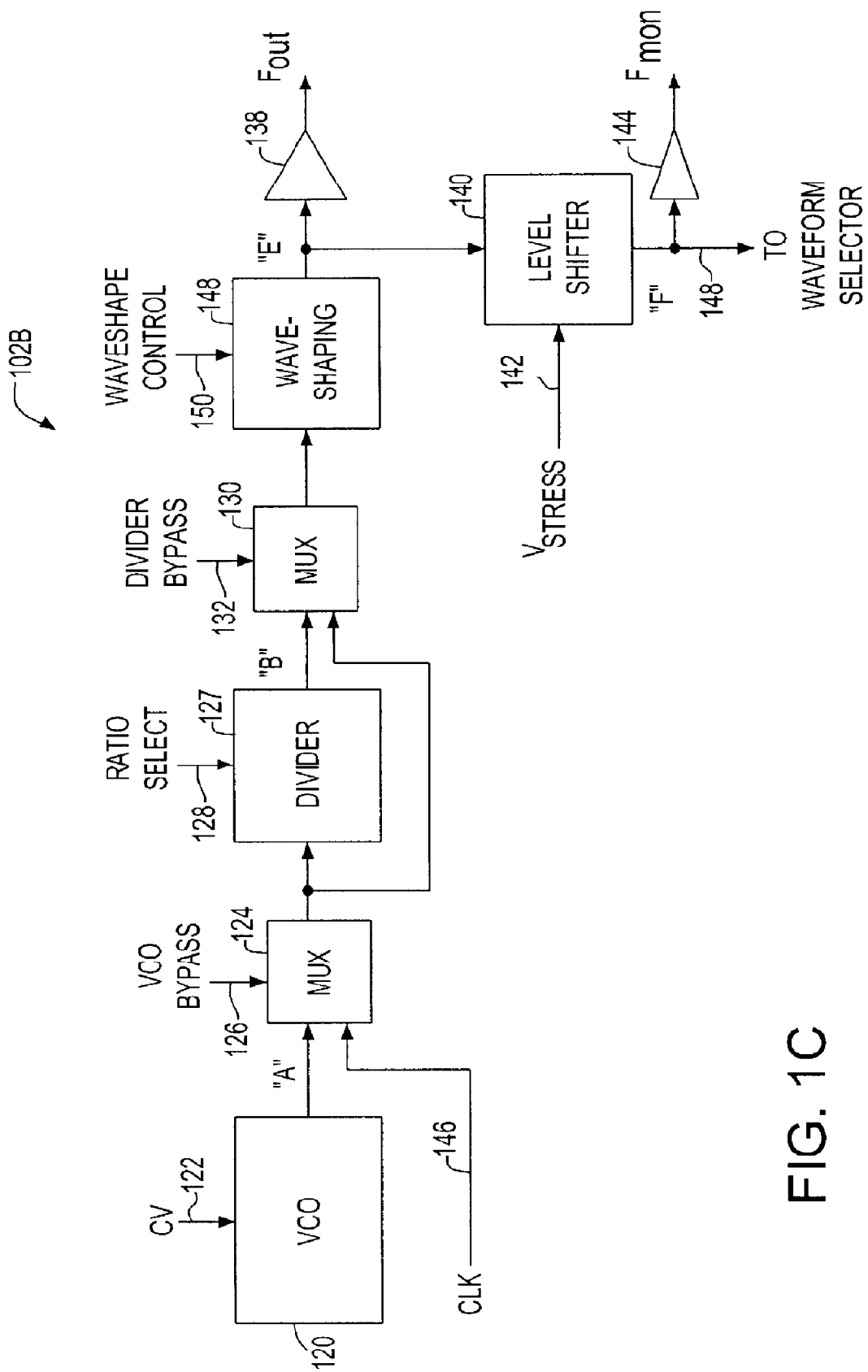

FIG. 1C is a block diagram of another embodiment of a waveform generator, in accordance with the invention.

Figure 1D:
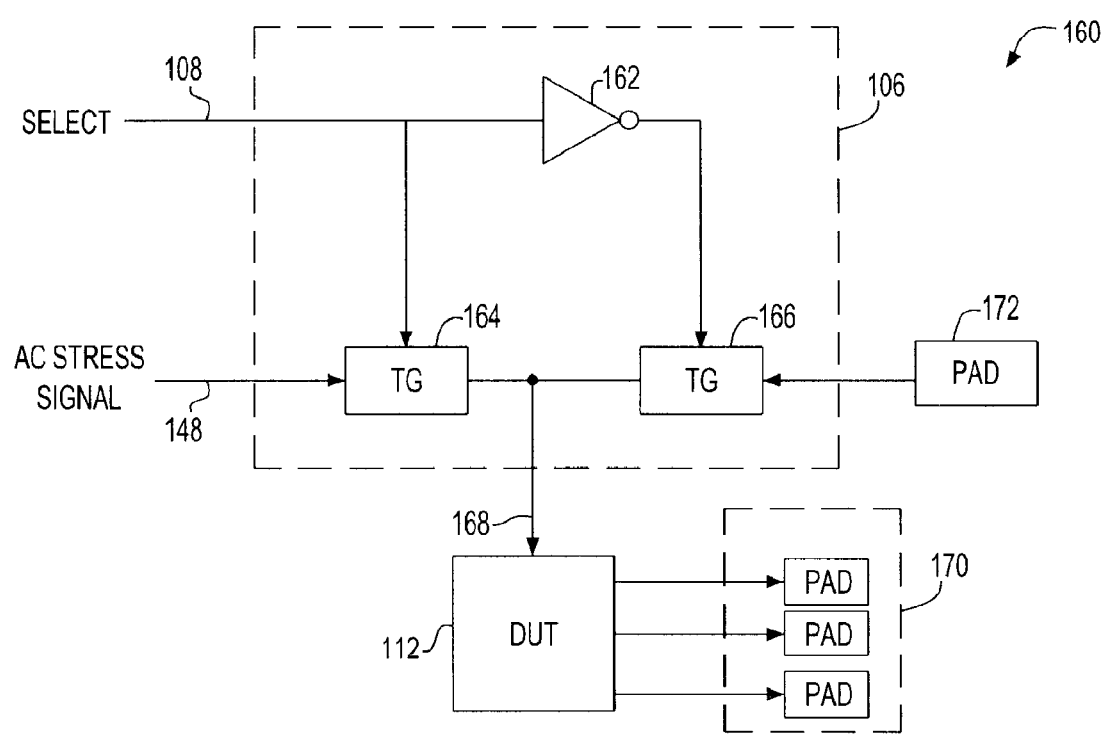

FIG. 1D is a block diagram showing a device under test and a waveform selector, in accordance with the invention.

FIGS. 2A-2H illustrate exemplary waveforms produced at various points within various embodiments of the present invention.

Figure 3:
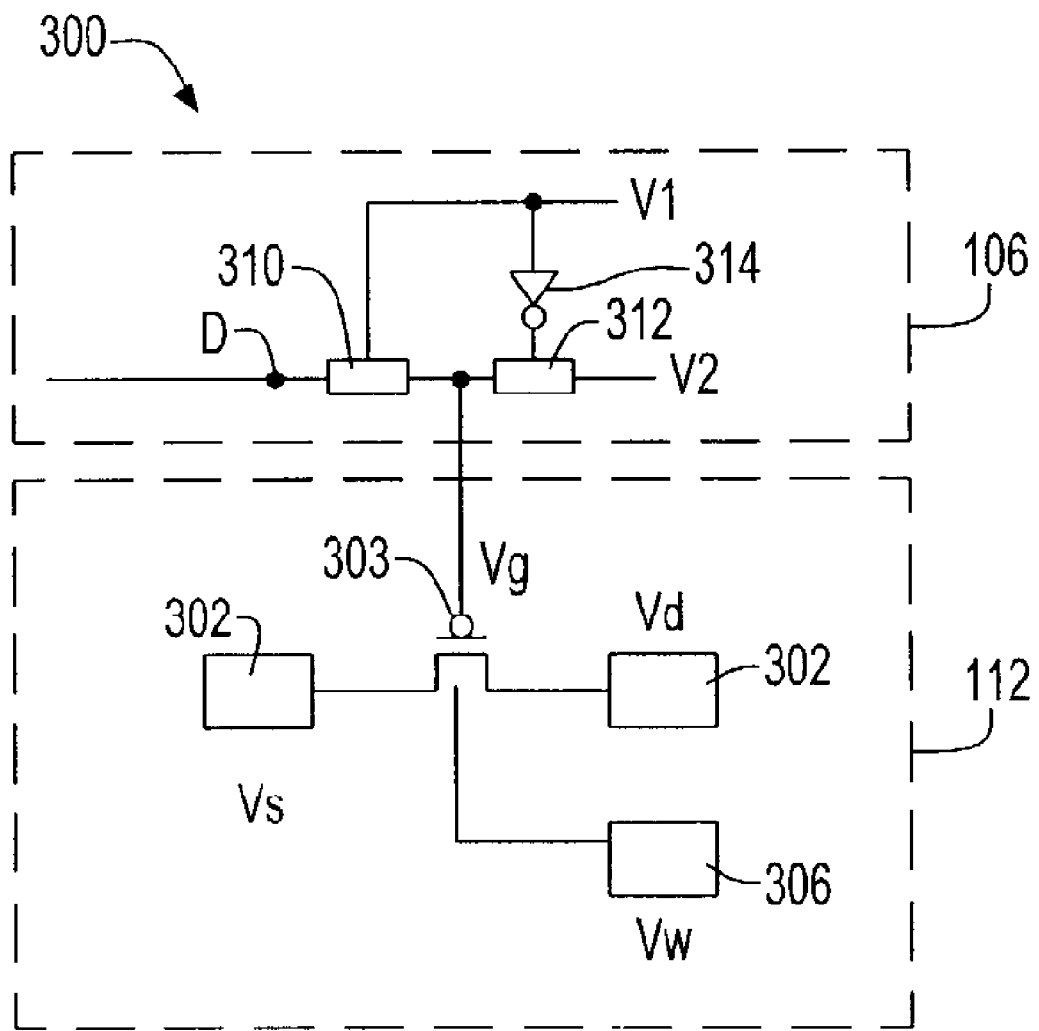

FIG. 3 is a diagram of on-chip circuit elements for applying stress signals to and measuring responses of a transistor device under test (DUT), in accordance with the present inventive technique.

Figure 4:
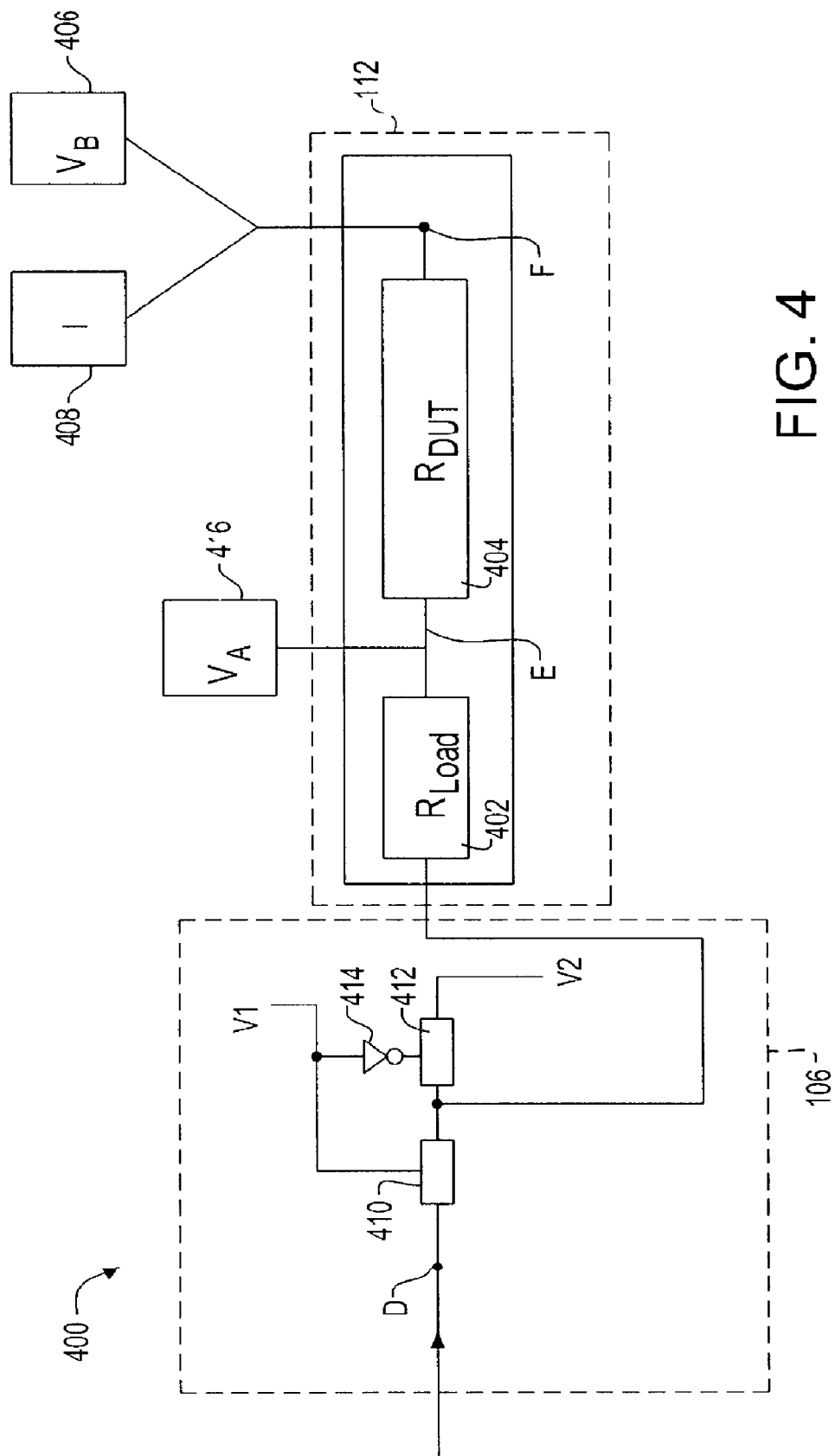

FIG. 4 is a diagram of on-chip circuit elements for applying stress signals to and measuring responses of a resistor device under test (DUT), in accordance with the present inventive technique.

Figure 5:
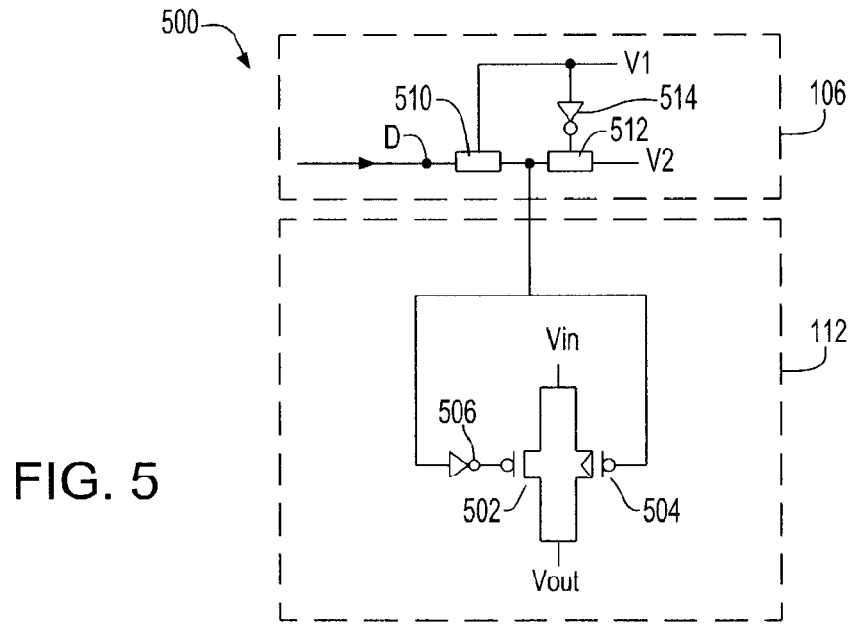

FIG. 5 is a diagram of on-chip circuit elements for applying stress signals to and measuring responses of a transmission gate device under test (DUT), in accordance with the present inventive technique.

Figure 6:
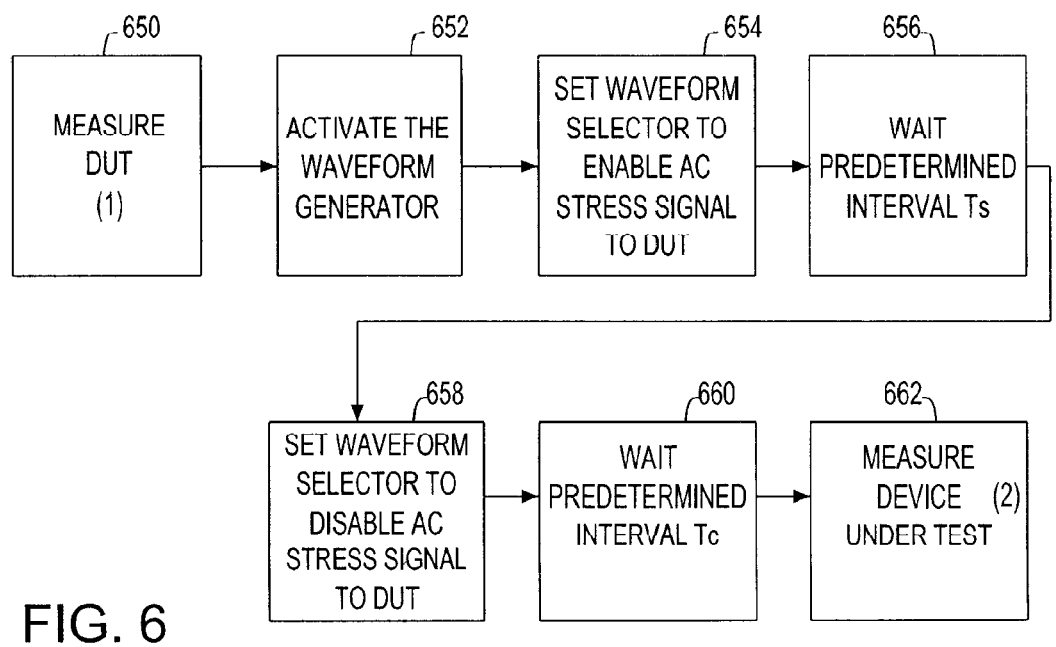

FIG. 6 is a flowchart showing exemplary process steps according to the present inventive technique.

DETAILED DESCRIPTION

FIG. 1A is a block diagram of circuitry 100 for characterizing wearout mechanisms in integrated circuit devices, in accordance with the invention. On-chip elements of this circuitry 101 comprise a waveform generator 102, a waveform selector 106 and a device under test (DUT) 112. These on-chip elements 101 provide the ability to apply electrical stressing signals, particularly high-frequency AC stressing signals, to the device-under-test 112 (DUT) and to measure changes in the characteristics of the DUT in response to those stresses. The DUT 112 can be, e.g., a transistor, transmission gate, or resistive element. The waveform generator 102 produces a repeating AC waveform according to the states of a set of waveform control signals 104. The control signals 104 control the waveform generator 102 to produce specific desired signal characteristics (e.g., to produce a specific desired wave shape, amplitude, frequency and/or duty-cycle) for producing specific types of stresses related to wearout mechanisms in the DUT 112. The waveform selector 106 is essentially a switch element that acts under control of a select signal 108 to select either the AC stress waveform from the waveform generator 102 or DC test signals 110 and apply the selected signal(s) to the DUT 112. The DUT 112 is equipped with direct measurement points to which external measurement equipment 114 is connected. The test access points can be used for measuring specific responses of the DUT to the stress signals applied by the waveform selector 106.

The waveform selector 106 functions as a selector switch between and the DUT 112 and stress signals (AC or DC). The external measurement equipment 114 monitors the test points on the DUT 112 to observe the response of the DUT 112 both while it is being subjected to the stress signals and after they are removed. Since the measurement equipment is already in place, it is possible to characterize the DUT 112 immediately upon removal of the stress signals, thereby reducing or eliminating the influence of recovery effects on the characterization, producing better characterization accuracy and making it possible to make better aging predictions for the DUT 112 under AC operating conditions.

Because the waveform generator 102 is on-chip and therefore closely co-located with the DUT 112, limitations of external pulse generators and their associated cabling and probes are eliminated. This permits very high-frequency AC stress waveforms to be applied to the DUT 112 as compared to those that would be possible using prior-art techniques. Using currently available semiconductor processes, it is realistic to expect that AC stress signal frequencies of up to a few gigahertzes can be achieved. By using this embodiment of the present invention, it is possible for the first time to measure and characterize the differences between DC and AC aging effects and thereby allow for an accurate calibration and definition of both AC and DC wearout models.

FIG. 1B is a block diagram an embodiment of a waveform generator 102A (compare 102, FIG. 1A) comprising a voltage controlled oscillator (VCO) 120, a divider 127, a duty cycle control circuit 134 and a level shifter 140. The VCO produces an output waveform "A" whose frequency is determined by a control voltage (CV) 122. The output of the VCO is passed through a first multiplexer (MUX) 124 to an input of the divider 127. The divider produces an output signal "B" at a fraction of the frequency of the signal at its input. The divide ratio to be used by the divider is specified by a ratio select signal 128. Preferably, the ratio select signal 128 is a multi-bit digital signal. For example, with a two bit ratio select signal 128, four different divide ratios could be selected, e.g., divide by 2, 4, 8 or 16.

The output signal "B" produced by the divider 127 is passed through a second multiplexer 130 to an input of the duty cycle control circuit 134, which sets the duty cycle of its output signal "C" according to the state of a duty cycle select signal 136. Preferably, the duty cycle control circuit 130 is programmable by the duty cycle select signal 136 to produce the output signal "C" having a 25, 50, or 75% duty cycle. The ability to adjust the duty cycle provides the ability to model situations where a device is subject to a known combination of DC and AC signals. For example, if a particular device is "switching" 25 percent of the operating time, and at a DC level for the remaining 75 percent of the time that it is operating, the duty cycle can be adjusted accordingly to approximate the real world usage of the device under test. (Note that these values are merely provided as examples, and other divider and duty cycle values are contemplated and within the scope of the present invention.)

The first multiplexer 124 acts as a bypass switch whereby the VCO 120 can be bypassed and a separately provided clock signal ("CLK") 146 can by applied to the input of the divider 127 instead. A VCO bypass signal 126 controls the multiplexer 124 to determine whether the multiplexer 124 applies the VCO output "A" or the clock signal "CLK" to the input of the divider 127.

Similarly, the second multiplexer 130 acts as a bypass switch whereby the divider 127 can be bypassed. A divider bypass signal 132 controls the second multiplexer 130 to determine whether it applies the output signal or the input signal of the divider 127 to the duty cycle control circuit 134. If the signal at the input of the divider 127 is applied to the duty cycle control circuit 134, then the divider is effectively bypassed.

The output signal "C" from the duty cycle control circuit is applied to an input of the level shifter 140. The level shifter 140 boosts the signal produced by the duty cycle control circuit up to the voltage level necessary to stress the DUT. The voltage at the output of the duty cycle control circuit 134 (and all of the previous stages) falls within the technology voltage (the normal operating voltage of the devices under test, for example, 1.2 volts). The level shifter 140 increases the voltage of the input signal from the duty cycle control circuit 108 to a stress voltage "Vstress" 142. The value of Vstress can be variable, but will typically be in the range of 1.4 to 1.8 times the "technology voltage" (the normal operating supply voltage applied to devices under normal operating conditions). This increased voltage above normal voltage levels causes accelerated aging, yet is not high enough to immediately destroy the device under test. The output signal ("D") 148 from the level shifter is passed on to the waveform selector (see 106, FIG. 1A). The stress voltage Vstress 142 can be provided, for example, via a dedicated test pad on the chip, or by any other suitable method. Only the DUT and the level shifter are subjected to Vstress.

To permit direct monitoring of the basic AC waveform and the AC stress waveform, buffers 138 and 144 are provided to buffer the output signals from the duty cycle control circuit 134 and level shifter 140, respectively. The output Fout of buffer 138 corresponds to the signal of the basic AC waveform so that it can be observed without any influence to the level shifter 140. The output Fmon of buffer 144 corresponds to the AC stress signal Vstress as it is applied to the DUT via the waveform selector. Both outputs, Fout of buffer 138 and output Fmon of buffer 144 are made available to external measurement equipment, preferably via a set of dedicated test pads.

The control signals 122, 126, 128, 132 and 136 are represented collectively in FIG. 1A as the waveform control signal 104. These control signals can be produced, for example, by on-chip test control registers written by an on-chip microprocessor or by a JTAG test mechanism, or by any other suitable means for providing test control signals to on-chip test circuitry. These and numerous other techniques suitable for applying test control signals to on-chip circuitry are well-known and understood by those of ordinary skill in the art. The examples given here should not be interpreted as being limiting.

FIG. 1C is a block diagram of another embodiment of a waveform generator 102B (compare 102, FIG. 1A and to 102A, FIG. 1B) comprising a voltage controlled oscillator (VCO) 120, a divider 127, wave shaping circuit 148 and a level shifter 140. The VCO produces an output waveform "A" whose frequency is determined by a control voltage (CV) 122. The output of the VCO is passed through a first multiplexer (MUX) 124 to an input of the divider 127. The divider produces an output signal "B" at a fraction of the frequency of the signal at its input. The divide ratio to be used by the divider is specified by a ratio select signal 128. Preferably, the ratio select signal 128 is a multi-bit digital signal. For example, with a two bit ratio select signal 128, four different divide ratios could be selected, e.g., divide by 2, 4, 8 or 16.

The output signal "B" produced by the divider 127 is passed through a second multiplexer 130 to an input of the wave shaping circuit 148, which shapes the waveform "B" at its input. By way of example, the wave shaping circuit 148 can be adapted to produce a triangle wave output or a sine wave output ("E"). Those of ordinary skill in the art will immediately understand that there are numerous possible waveshaping circuits (e.g., integrators, differentiators, filters, various R-C circuits, etc.) to produce any of a wide variety of waveforms from its input signal. The wave shaping circuit 148 is responsive to waveshape control signal 150 to affect the type of waveshaping performed by the waveshaping circuit 148. For example, a one-bit waveshape control signal 150 could be used to select between sine and triangle wave shaping functions.

The first multiplexer 124 acts as a bypass switch whereby the VCO 120 can be bypassed and a separately provided clock signal ("CLK") 146 can by applied to the input of the divider 127 instead. A VCO bypass signal 126 controls the multiplexer 124 to determine whether the multiplexer 124 applies the VCO output "A" or the clock signal "CLK" to the input of the divider 127.

Similarly, the second multiplexer 130 acts as a bypass switch whereby the divider 127 can be bypassed. A divider bypass signal 132 controls the second multiplexer 130 to determine whether it applies the output signal or the input signal of the divider 127 to the duty cycle control circuit 134. If the signal at the input of the divider 127 is applied to the wave shaping circuit 148, then the divider 127 is effectively bypassed.

The output signal "E" from the wave shaping circuit 148 is applied to an input of the level shifter 140. The level shifter 140 boosts the signal produced by the duty cycle control circuit up to the voltage level necessary to stress the DUT. The voltage at the output of the wave shaping circuit 148 (and all of the previous stages) falls within the technology voltage (the normal operating voltage of the devices under test, for example, 1.2 volts). The level shifter 140 increases the voltage of the input signal from the wave shaping circuit 148 to a stress voltage "Vstress" 142. The value of Vstress can be variable, but will typically be in the range of 1.4 to 1.8 times the "technology voltage" (the normal operating supply voltage applied to devices under normal operating conditions). This increased voltage above normal voltage levels causes accelerated aging, yet is not high enough to immediately destroy the device under test. The output signal ("F") 148 from the level shifter 140 is passed on to the waveform selector (see 106, FIG. 1A). The stress voltage Vstress 142 can be provided, for example, via a dedicated test pad on the chip, or by any other suitable method. Only the DUT and the level shifter are subjected to Vstress.

As discussed before in the embodiment illustrated in FIG. 1B, to permit direct monitoring of the basic AC waveform and the AC stress waveform, buffers 138 and 144 are provided to buffer the output signals from the duty cycle control circuit 134 and level shifter 140, respectively. The output Fout of buffer 138 corresponds to the signal of the basic AC waveform so that it can be observed without any influence to the level shifter 140. The output Fmon of buffer 144 corresponds to the AC stress signal Vstress as it is applied to the DUT via the waveform selector. Both outputs, Fout of buffer 138 and output Fmon of buffer 144 are made available to external measurement equipment, preferably via a set of dedicated test pads.

The control signals 122, 126, 128, 132 and 150 are represented collectively in FIG. 1A as the waveform control signal 104. These control signals can be produced, for example, by on-chip test control registers written by an on-chip microprocessor or by a JTAG test mechanism, or by any other suitable means for providing test control signals to on-chip test circuitry. These and numerous other techniques suitable for applying test control signals to on-chip circuitry are well-known and understood by those of ordinary skill in the art. The examples given here should not be interpreted as being limiting.

FIG. 1D is a block diagram of a portion 160 of the on-chip circuitry 101 showing a DUT 112 and waveform selector 106. The waveform selector 106 comprises a first transmission gate 164, a second transmission gate 166, and a logic inverter 162. In this embodiment, the waveform selector 106 connects either the AC stress signal 148 or an external signal provided via a dedicated pad 172 to the DUT 112. The transmission gates 164 and 166 each act as a single pole switch. The select signal 108 controls the first transmission gate 164, while the logical inverse of select signal 108 (produced by the inverter 162) controls the second transmission gate 166, such that when the first transmission gate 164 is enabled (connected to the DUT stress signal 168), the second transmission gate 166 is disabled (disconnected from the DUT stress signal 168), and vice versa. The DUT stress signal 168 is applied to the DUT 112. A set of test points on the DUT is connected directly to a set of test monitoring pads 170 (test access points), whereby external equipment can gain direct access to the DUT for measurement and characterization.

When characterizing a DUT 112, typically an initial set of "baseline" parameters would be measured to characterize the DUT 112 prior to stressing it. After stressing the DUT 112 by means of on-chip circuitry described hereinabove, the DUT 112 would be re-characterized via the measurement interface. Any changes in device characteristics (such as a post-stress shift in threshold voltage) in response to the applied stresses would be used to predict the rate at which the measured characteristic(s) would degrade under normal low-stress operating conditions, thereby providing the basis for a good estimate of device lifetime.

The rates of degradation due to NBTI, CHC and EM effects are highly relevant in making useful device lifetime predictions. However, in the case of NBTI in particular, there is a recovery effect that can occur whereby observable accelerated aging effects (e.g., threshold shift) due to applied "overstresses" can tend to reverse themselves after a period of time. That is, the degradation (e.g., threshold shift) measured immediately after removing the stress will be greater than the degradation measured at some time later. Using conventional prior-art stress/characterization techniques wherein considerable time can elapse between stress and measurement, mischaracterization of the rate of degradation occurs, resulting in inaccurate device lifetime predictions. By providing an on-chip mechanism for stressing the DUT with a dedicated measurement interface for characterization, the DUT can be characterized immediately after stressing and/or at any desired time thereafter. The ability to characterize the DUT before any "recovery effect" can occur allows more accurate characterization of the extent of degradation due to the applied stresses and consequently, better predictions of device lifetime.

Figure 2A:
Figure 2B:
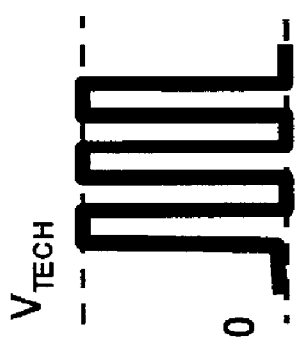
Figure 2C:
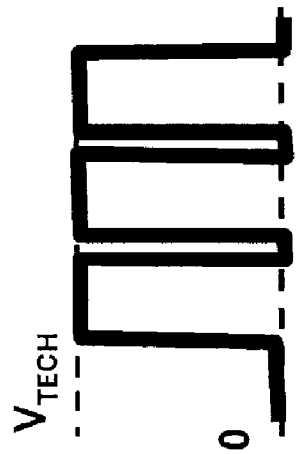
Figure 2D:
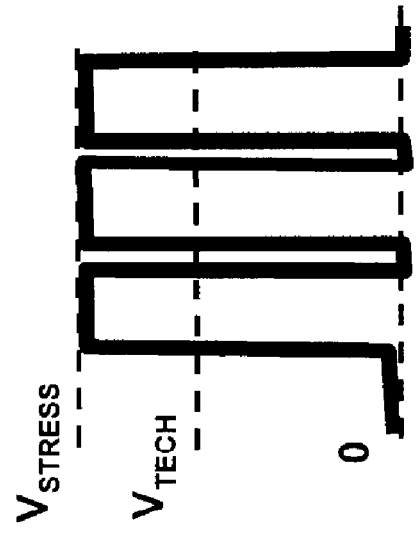

FIGS. 2A-2H illustrate exemplary waveforms produced at various points within the different embodiments of the present invention described hereinabove. FIG. 2A shows a representative waveform as seen at point "A" in FIG. 1B. This represents the signal (waveform) as it is output from the oscillator 120. Typically, a signal at this point will oscillate between 0 volts and Vtech (the technology voltage). FIG. 2B shows the waveform at point B in FIG. 1B. This represents the signal (waveform) as it is output from the divider 127. FIG. 2C shows the waveform at point C in FIG. 1B. This represents the signal (waveform) as it is output from the duty cycle control circuit 134. The signal shown in FIG. 2B has a duty cycle greater than 50%, and the signal is at a level of Vtech more of the time than at 0 volts. FIG. 2D shows the waveform at point D in FIG. 1B. This represents the signal (waveform) as it is output from level shifter 140. In this case, the signal oscillates between 0 volts and Vstress, where Vstress is a stress voltage which exceeds the technology voltage typically in the range of 1.4 to 1.8 times the technology voltage.

Figure 2E:
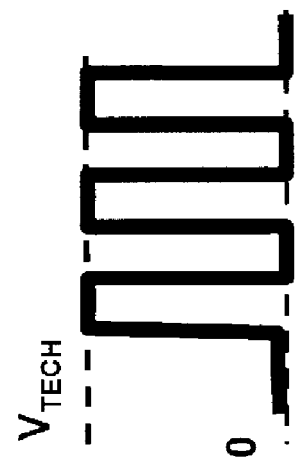
Figure 2F:
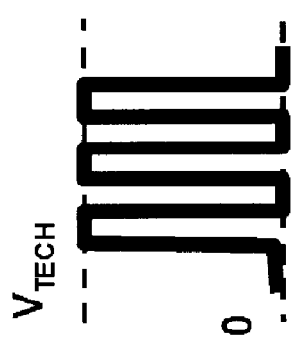
Figure 2G:
Figure 2H:
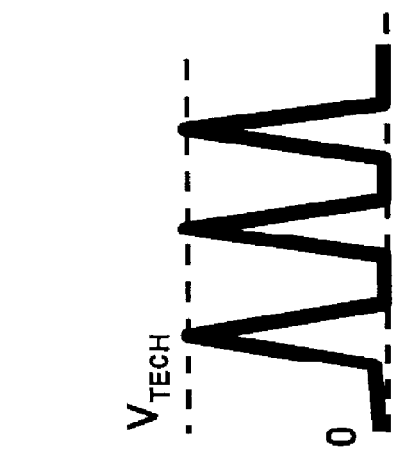

FIG. 2E shows the waveform at point A in FIG. 1C. This represents the signal (waveform) as it is output from the oscillator 120 and is comparable to the signal shown in FIG. 2A. The signal oscillates between 0 volts and Vtech. FIG. 2F shows the waveform at point B in FIG. 1C. This represents the signal (waveform) as it is output from the divider 127. FIG. 2G shows the waveform at point E in FIG. 1C. This represents the signal (waveform) as it is output from an embodiment of the wave shaping circuit 148 adapted to produce a triangle waveform. FIG. 2H shows the waveform at point F in FIG. 1C. This represents the signal (waveform) as it is output from level shifter 140. In this case, similar to FIG. 1B, the signal oscillates between 0 volts and Vstress, where Vstress is a stress voltage which exceeds the technology voltage typically in the range of 1.4 to 1.8 times the technology voltage.

FIG. 3 is a diagram of on-chip circuit elements 300 (waveform selector 106 and DUT 112, compare 106 and 112 FIGS. 1A, 1D) for applying stress signals to and measuring responses of a transistor device under test (DUT) 112, in accordance with the present inventive technique. These circuit elements 300 comprise a first transistor switch 310, a second transistor switch 312 and an inverter 314. Preferably, the transistor switches 310 and 312 are transmission gates. Test access points 302, 304, and 306 (part of the measurement interface) are provided to the source, drain and well, respectively of a MOSFET transistor DUT 112. Voltages at these test access points 302, 304 and 306 are represented by Vs, Vd, and Vw respectively. The first transistor switch 310 is controlled by a control signal V1 to connect an AC stress signal "D" (which corresponds to signal "D" at the input of the waveform selector 106 of FIGS. 1B-1C) to a gate terminal 303 of the transistor device under test 112. The signal V1 is inverted by inverter 314 and used to control the second transistor switch 312 such that when the first transistor switch 310 is enabled ("closed"), the second transistor switch 312 is disabled ("open") and vice-versa. The second transistor switch 312, when enabled, applies a voltage V2 (preferably a DC stress signal from the aforementioned measurement interface) to the gate terminal 303 of the transistor DUT 112. The voltage at the gate terminal 303 is $V_g$. Device under test 112 is a MOSFET having a gate 303, source 302, drain 304, and well 306. Vg represents the gate voltage.

During AC stressing of the device under test 112, signal V1 is asserted and an AC stress waveform on point "D" is applied to gate 303 via the first transistor switch 310. After a predetermined time period (e.g. 1, 5, 10, or 30 minutes, etc. . . . ), the AC signal waveform is disconnected from the gate 303 by de-asserting V1. When V1 is de-asserted, V2 is applied to the gate 303, which acts as the gate voltage for purposes of device measurement and/or characterization. One or more measurements of the device under test 112 are performed. An important advantage of the present invention is that by having all needed circuitry within the IC, the time between stressing and measurement of the DUT can be made very short, and the duration is very controllable and repeatable to a level not possible with externally supplied signal generators.

One of the detrimental effects of wearout aging is that it significantly shifts threshold voltage. The threshold voltage of a transistor affects the gate voltage at which a transistor in a digital circuit changes state from a "0" to a "1" (or vise versa). Shifts in threshold voltage can adversely affect the complex timing of digital circuits and cause faulty operation. After subjecting the device under test 112 of FIG. 3 to an AC stress signal, the threshold voltage Vt can be measured (via standard techniques known in the art) and compared with previously-made baseline measurements to determine how the device under test 112 has degraded in response to the AC stress signal.

FIG. 4 is a diagram of on-chip circuit elements 400 (waveform selector 106 and DUT 112, compare 106 and 112 FIGS. 1A, 1D) for applying stress signals to and measuring responses of a resistor device under test (DUT) 112, in accordance with the present inventive technique. In this case, the DUT comprises a resistor DUT 404 ($R_{DUT}$) and a load resistor 402 ($R_{Load}$). The circuit elements 400 further comprise a first transistor switch 410, a second transistor switch 412 and an inverter 414. Preferably, the transistor switches 410 and 412 are transmission gates. Test access points 406 and 408 connect to a first end ("F") of the resistive DUT 404 and test access point 411 connects to a second end ("E") of the resistive DUT 404. The first transistor switch 410 is controlled by a control signal V1 to connect an AC stress signal "D" (which corresponds to signal "D" at the input of the waveform selector 106 of FIGS. 1B-1C) to one end of the load resistor 402. The other end of the load resistor connects to the second end of $R_{DUT}$ 404 ("E"). The signal V1 is inverted by inverter 414 and used to control the second transistor switch 412 such that when the first transistor switch 410 is enabled ("closed"), the second transistor switch 412 is disabled ("open") and vice-versa. The second transistor switch 412, when enabled, applies a voltage V2 (preferably a DC stress signal from the aforementioned measurement interface) to load resistor 402.

During AC stressing of the device under test 112, signal V1 is asserted and an AC stress waveform on point "D" is applied to the load resistor 402 via the first transistor switch 410. After a predetermined time period (e.g. 1, 5, 10, or 30 minutes, etc. . . . ), the AC signal waveform is disconnected by de-asserting V1. When V1 is de-asserted, V2 is applied to the load resistor, which acts as a reference voltage for purposes of device measurement and/or characterization. One or more measurements of the device under test 112 are performed. An important advantage of the present invention is that by having all needed circuitry within the IC, the time between stressing and measurement of the DUT can be made very short, and the duration is very controllable and repeatable to a level not possible with externally supplied signal generators.

In the case of resistive elements, one of the most significant degradation mechanisms is electromigration. Electromigration aging is a type of semiconductor aging in which the transport of material is caused by the gradual movement of the ions in a conductor due to the momentum transfer between conducting electrons and diffusing metal atoms. The effect is important in applications where high direct current densities are used, such as in microelectronics and related structures. As the structure size in electronics such as integrated circuits (ICs) decreases, the practical significance of electromigration increases, making it an important parameter to measure.

The resistive DUT structure 112 in this embodiment comprises a load resistor 402 ($R_{Load}$) and a resistor to be characterized for electromigration effects, denoted as 404 ($R_{DUT}$). The $R_{Load}$ resistor 402 satisfies the condition $R_{Load} >> R_{DUT}$ to allow a conversion of a voltage waveform to a current waveform (the value of the current across $R_{DUT}$ 404 ranges between (VStress-$V_B$)/R1$_{Load}$ and -$V_B$/$R_{Load}$).

In this case, both unidirectional or bidirectional AC and DC current electromigration stressing of the $R_{DUT}$ resistor 404 can be investigated. The direct pads $V_A$, I and $V_B$, together with V2 (with logic state=0) can be used for 4-point contact measurements.

FIG. 5 is a diagram of on-chip circuit elements 500 (waveform selector 106 and DUT 112, compare 106 and 112 FIGS. 1A, 1D) for applying stress signals to and measuring responses of a transmission gate device under test (DUT) 112, in accordance with the present inventive technique. These circuit elements 500 comprise a first transistor switch 510, a second transistor switch 512 and an inverter 514. The DUT 112 in this case is a transmission gate comprising two transistors 502 and 504 and an inverter 506. An input "Vin" and an output "Vout" are made available for external connection, e.g., via a pair of dedicated test pads for each, to facilitate 4-point testing and measurement. Preferably, the transistor switches 512 and 514 are transmission gates. The first transistor switch 512 is controlled by a control signal V1 to connect an AC stress signal "D" (which corresponds to signal "D" at the input of the waveform selector 106 of FIGS. 1B-1C) to the DUT 112. The signal V1 is inverted by inverter 514 and used to control the second transistor switch 512 such that when the first transistor switch 510 is enabled ("closed"), the second transistor switch 512 is disabled ("open") and vice-versa. The second transistor switch 512, when enabled, applies a voltage V2 (preferably a DC stress signal from the aforementioned measurement interface) to the DUT 112.

During AC stressing of the device under test 112, signal V1 is asserted and an AC stress waveform on point "D" is applied via the first transistor switch 10. After a predetermined time period (e.g. 1, 5, 10, or 30 minutes, etc. . . . ), the AC signal waveform is disconnected by de-asserting V1. When V1 is de-asserted, V2 is applied to the transmission gate. One or more measurements of the device under test 112 are performed.

The embodiments shown in FIGS. 3, 4 and 5 are merely examples of possible DUT structures, and are not comprehensive of all the possibilities that the present invention allows. Other DUT structures and devices and other appropriate terminal configurations are possible. Most any semiconductor element, such as a resistor, diode, interconnect, or transistor can be a device under test, or the device under test can be a combination of multiple semiconductor elements.

FIG. 6 shows a flowchart 600 indicating exemplary process steps to perform the method of the present invention.

In a first process step 650 ("Measure DUT (1)"), an initial pre-stress characterization of a DUT is performed to establish a reference baseline to compare with later measurements.

In a next process step 652 ("Activate the waveform generator"), the on-chip waveform generator (102 of FIG. 1A) is controlled via the waveform control signal to produce an AC waveform having the desired voltage, frequency, and duty cycle for stressing the DUT.

In a next process step 654, ("Set waveform selector to enable AC stress signal to DUT") the waveform selector (106 of FIG. 1A) is set to route the AC stress signal from the on-chip waveform generator (102 of FIG. 1A) to the device under test (112 of FIG. 1).

In a next process step 656, ("Wait predetermined time interval Ts"), the AC stress signal is applied to the device under test (112 of FIG. 1A) for a predetermined interval Ts (e.g. ranging from 1 second to 10,000 seconds).

In a next process step 658, ("Set waveform selector to disable AC stress signal to DUT"), after the predetermined time Ts has expired, the waveform selector (106 of FIG. 1) is set to prevent the AC stress signal from the on-chip waveform generator (102 of FIG. 1) from being supplied to the device under test (114 of FIG. 1)

In a next process step 660, a predetermined interval Tc is allowed to pass prior to performing a second device characterization in a final process step 662 ("Measure Device Under Test (2)").

The time interval Tc may be on the order of 10 milliseconds or less. The present invention provides for precise control of time interval Tc. This facilitates repeatable experiments, which is very important when performing various wearout characterizations, such as NBTI characterizations.

With some wearout mechanisms, such as NBTI, there is a phenomenon called "recovery." During recovery, the damage caused by the stress signal begins to repair itself and the device tends towards its previous condition prior to the application of the stress signal. It is therefore desirable to have Tc be a short and controlled time interval, to minimize the recovery effects prior to the measurement of the damage that occurred as a result of the stress signal. The present invention provides the ability to very quickly (e.g. less than 300 microseconds) transition from stressing to measuring, allowing an accurate wearout assessment, while minimizing the impact of recovery effects.

As can be seen from the aforementioned description, the present invention provides an improved method and apparatus for dynamic characterization of reliability wearout mechanisms, and serves to promote continued high reliability for semiconductor devices and circuits.

It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. Apparatus for dynamic stress characterization of a device under test, comprising on a semiconductor wafer:
an integrated device to be tested (DUT);
an on-chip waveform generator for generating an AC stress signal;
a waveform selector operating according to the state of a selection signal to select between the AC stress signal and an external signal, and to apply the selected signal to the integrated device to be tested;
a set of test access points for connecting external measurement equipment to the integrated device to be tested; and
wherein the on-chip waveform generator further comprises:
a voltage controlled oscillator;
a divider connected by a first multiplexer to the oscillator;
a duty cycle control circuit connected by a second multiplexer to the divider; and
a level shifter connected to the duty cycle control circuit.

2. Apparatus according to claim 1, wherein said waveform generator is responsive to a waveform control signal to select specific desired waveform characteristics.

3. Apparatus according to claim 2, wherein said desired waveform characteristics include a plurality of frequencies.

4. Apparatus according to claim 2, wherein said desired waveform characteristics include a plurality of duty cycle values.

5. Apparatus according to claim 2, wherein said desired waveform characteristics include a plurality of waveform shapes.

6. Apparatus according to claim 1, wherein the divider is configured to divide the frequency of signal at an input thereof by a divide ratio selected from a predetermined set of divide ratios, the selection being determined by the state of a ratio select signal.

7. Apparatus according to claim 1, wherein the duty cycle control circuit is configured to convert a signal at an input thereof to an output signal having a duty cycle selected from a predetermined set of duty cycle values, the selection being determined by the state of a duty cycle select signal.

8. Apparatus for dynamic stress characterization of a device under test, comprising on a semiconductor wafer:
an integrated device to be tested (DUT);
an on-chip waveform generator for generating an AC stress signal;
a waveform selector operating according to the state of a selection signal to select between the AC stress signal and an external signal, and to apply the selected signal to the integrated device to be tested;
a set of test access points for connecting external measurement equipment to the integrated device to be tested; and
wherein the on-chip waveform generator further comprises:
an oscillator;
a divider connected by a first multiplexer to the oscillator;
a waveshaping circuit connected by a second multiplexer to the divider; and
a level shifter connected to the duty cycle control circuit.

9. Apparatus according to claim 8, wherein the divider is configured to divide the frequency of signal at an input thereof by a divide ratio selected from a predetermined set of divide ratios, the selection being determined by the state of a ratio select signal.

10. Apparatus according to claim 8, wherein the waveshaping circuit is configured to convert a signal at an input thereof to an output signal having having one of a predetermined set of waveshapes depending upon the state of a waveshape control signal.

11. Apparatus according to claim 1, wherein the integrated device (DUT) is a transistor.

12. Apparatus according to claim 1, wherein the integrated device (DUT) is a resistive element.

13. Apparatus according to claim 1, wherein the integrated device (DUT) is a transmission gate.

14. A method for experimentally determining aging effects in a device under test, wherein the device under test comprises one or more semiconductor elements, the method comprising the steps of:
- providing a semiconductor wafer having formed thereupon a device under test (DUT), an on-chip waveform generator, a waveform selector, and test access points for connecting external equipment;
- connecting external measurement equipment to the test access points;
- performing a set of initial pre-stress measurements with the external measurement equipment to provide a baseline pre-stress characterization of the device under test;
- controlling the waveform generator to produce a desired AC stress waveform;
- controlling the waveform selector to apply and maintain application of the AC stress waveform to the device under test (DUT) for a predetermined first time interval Ts;
- after expiration of the predetermined first time interval Ts, controlling the waveform selector to disconnect the AC stress waveform from the device under test and to connect the device under test to an externally provided signal;
- after connection of the externally provided signal to the device under test, performing a set of post-stress measurements with the external measurement equipment to provide a post-stress characterization of the device under test for comparison with the pre-stress characterization of the device under test.

15. A method according to claim 14, further comprising the step of controlling the waveform generator to produce a waveform that reaches between 1.4 and 1.8 times the technology voltage for the device under test.

16. A method according to claim 14, wherein the first time interval Ts is between 1 second and 10000 minutes.

17. A method according to claim 14, further comprising delaying post-stress measurement of the device under test by a precisely controlled second time interval Tc.

18. A method according to claim 17, wherein the second time interval Tc is between 1 microsecond and 100 milliseconds.

19. A method according to claim 14, wherein the device under test is a transistor.

* * * * *